(12) United States Patent  
Saliba

(10) Patent No.: US 7,162,678 B2
(45) Date of Patent: Jan. 9, 2007

(54) EXTENDED ERROR CORRECTION CODES

(75) Inventor: George A. Saliba, Northborough, MA (US)

(73) Assignee: Quantum Corporation, San Jose, CA (US)

( * ) Notice: Subject to any disclaimer, the term of this patent is extended or adjusted under 35 U.S.C. 154(b) by 663 days.

(21) Appl. No.: 10/390,380

(22) Filed: Mar. 14, 2003

(65) Prior Publication Data

US 2004/0181734 A1  Sep. 16, 2004

(51) Int. Cl.
*H03M 13/00* (2006.01)
(52) U.S. Cl. ............... 714/758; 714/756; 714/784; 714/786; 714/755
(58) Field of Classification Search ........ 714/784–786, 714/755–756, 758
See application file for complete search history.

(56) References Cited

U.S. PATENT DOCUMENTS

| | | | |
|---|---|---|---|
| 4,549,298 A * | 10/1985 | Creed et al. ........... | 714/758 |
| 4,802,173 A | 1/1989 | Baggen | |
| 5,920,578 A | 7/1999 | Zook | |
| 6,772,386 B1 * | 8/2004 | Iwata et al. .......... | 714/755 |

OTHER PUBLICATIONS

Li, Zongwang et al. (2003) "Design and Implementation of a novel algorithm for Iterative Decoding of Product Codes" *High Technol. Lett.* (*Engl. Lang. Ed.*), vol. 9, No. 1: 35-40.

Decoding Organization for Product Codes. (1992) Research Disclosure, vol. 342, No. 38.

European Search Report mailed on Jun. 22, 2004, for EP patent application No. EP 04 25 1344 filed on Mar. 9, 2004, 3 pages.

* cited by examiner

*Primary Examiner*—Guy J. Lamarre
(74) *Attorney, Agent, or Firm*—Morrison & Foerster LLP

(57) ABSTRACT

Errors in data retrieved from a storage medium are verified by retrieving a plurality of data blocks from the storage medium. A data set having data from multiple data blocks is selected, where the data set includes a plurality of rows corresponding to the data bocks and a row has data from a data block corresponding to the row. One or more error correction codes (ECCs) are retrieved from the storage medium, where the one or more ECCs correspond to the data set. A plurality of check sums are retrieved from the storage medium, where a check sum corresponds to a data block. Data blocks retrieved from the storage medium having errors are identified using the check sums corresponding to the data blocks. When the number of data blocks identified as having errors is greater than the number of ECCs for the data set, a first set of rows in the data set corresponding to the data blocks identified as having errors is selected, where the number of rows in the first set of rows is equal to the number of ECCs for the data set and less than the number of data blocks identified as having errors. Data for the first set of rows are generated using the ECCs for the data set, and the rows corresponding to the data blocks identified as having errors are verified based on the generated data for the first set of rows.

27 Claims, 7 Drawing Sheets

EXTENDED ERROR CORRECTION CODES

BACKGROUND

1. Field of the Invention

The present application generally relates to storing data on a storage medium, and more particularly to using error correction codes to verify errors in data stored in a storage medium.

2. Related Art

Data is stored in a storage device by writing the data to a storage medium in the storage device. The stored data can be later retrieved from the storage device by reading the data from the storage medium. However, for a number of reasons, an error may exist in the data retrieved from the storage device, meaning that the stored data cannot be retrieved or is different from the data originally stored on the storage medium. For example, a portion of the stored data on the storage medium may degenerate over time such that the portion of the stored data cannot be properly read at a later time.

In a conventional technique to correct such errors, an error correction code (ECC) is generated for the data and stored with the data in the storage medium. When the stored data is later retrieved and an error is detected, the ECC can be used to correct the retrieved data.

In one approach to using ECCs, data is arranged in an array and ECCs are generated for the data in two dimensions of the array (e.g., along the rows and the columns of the array). These are typically referred to as two-dimensional ECCs. One disadvantage of this approach is that as the size of the array increases so does the amount of time needed to generate the ECCs and to correct the retrieved data.

In another approach to using ECCs, ECCs are generated for data blocks and dispersed within the data blocks when stored in the storage medium. Because the locations of the ECCs dispersed within the data blocks need to be stored, one disadvantage of this approach is that it increases the amount of overhead dedicated to the ECCs, which can reduce the overall storage capacity of the storage device.

Additionally, in conventional techniques for correcting errors using ECCs, the size of the data blocks that can be used to store data on a storage medium can be constrained by the size of the errors that are expected. More particularly, data blocks are typically sized to correspond to the average size of the errors that are expected. Thus, small sized data blocks are used if small sized errors are expected, and large sized data blocks are used if large sized errors are expected.

However, for a number of reasons, it may be desirable to use a data block size that does not correspond to the average size of the errors that are expected. For example, if large amounts of data is typically stored and retrieved from a storage medium, then large data blocks are desirable, in part, to reduce access time and overhead. However, if the average size of the errors is small relative to the size of the data blocks, then the error correction is relatively inefficient because the entire data block needs to be corrected even for a small error.

SUMMARY

In one exemplary embodiment, errors in data retrieved from a storage medium are verified by retrieving a plurality of data blocks from the storage medium. A data set having data from multiple data blocks is selected, where the data set includes a plurality of rows corresponding to the data bocks and a row has data from a data block corresponding to the row. One or more error correction codes (ECCs) are retrieved from the storage medium, where the one or more ECCs correspond to the data set. A plurality of check sums are retrieved from the storage medium, where a check sum corresponds to a data block. Data blocks retrieved from the storage medium having errors are identified using the check sums corresponding to the data blocks. When the number of data blocks identified as having errors is greater than the number of ECCs for the data set, a first set of rows in the data set corresponding to the data blocks identified as having errors is selected, where the number of rows in the first set of rows is equal to the number of ECCs for the data set and less than the number of data blocks identified as having errors. Data for the first set of rows are generated using the ECCs for the data set, and the rows corresponding to the data blocks identified as having errors are verified based on the generated data for the first set of rows.

DETAILED DESCRIPTION

The following description sets forth numerous specific configurations, parameters, and the like. It should be recognized, however, that such description is not intended as a limitation on the scope of the present invention, but is instead provided to provide a better description of exemplary embodiments.

Figure 1:
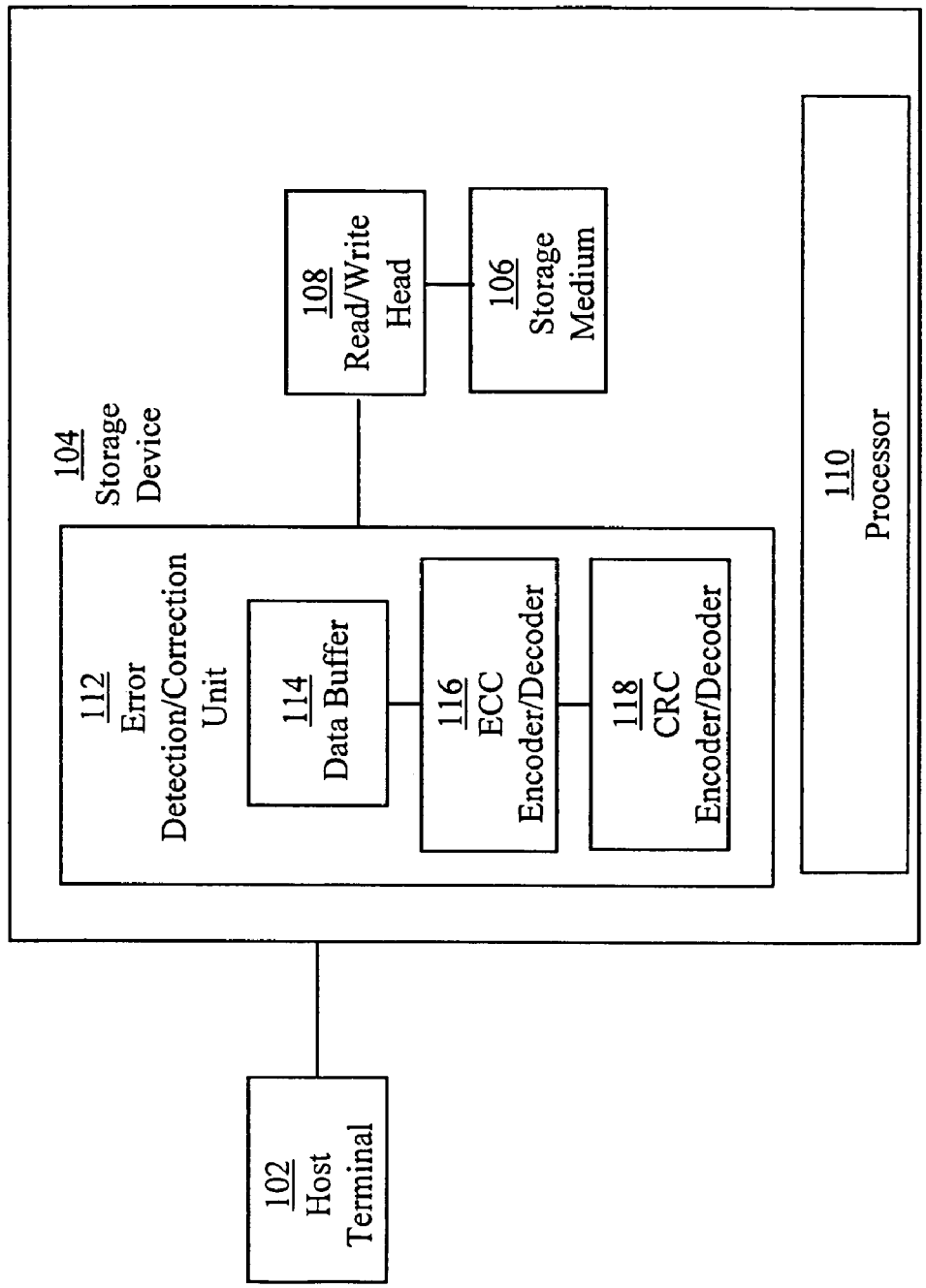
FIG. 1 depicts an exemplary host terminal connected to an exemplary storage device.

With reference to FIG. 1, a host terminal 102 is depicted connected to a storage device 104. Host computer 102 can be any type of computer, such as a personal computer, a workstation, a server, and the like. Storage device 104 can be any type of storage drive, such as a tape drive, a hard drive, and the like. It should be recognized that host terminal 102 can be connected to any number of storage devices 104, and any number of host terminals 102 can be connected to one or more storage devices 104.

With continued reference to FIG. 1, in one exemplary embodiment, storage device 104 is configured to detect and correct errors in data stored in storage device 104. More specifically, when data stored in storage device 104 is retrieved, storage device 104 is configured to use error correction codes (ECCs) and check sums, such as cyclic redundancy checking (CRC) codes, to detect and correct errors in the retrieved data, such as if the retrieved data is different from the data that was originally stored in storage device 104 or if the stored data cannot be retrieved.

In the embodiment depicted in FIG. 1, storage device 104 includes a storage medium 106, a channel and read/write head 108, a processor 110, and an error detection/correction unit 112. In storage device 104, data is stored in storage medium 106. Read/write head 108 reads and/or writes data to storage medium 106. Processor 110 controls the operation of storage device 104, including the operation of channel and read/write head 108. As will be described in greater detail below, error detection/correction unit 112 detects and corrects errors in data stored in storage medium 106.

In the present exemplary embodiment, error detection/correction unit 112 includes a data buffer 114, an ECC encoder/decoder 116, and a CRC encoder/decoder 118. When data is to be stored on storage medium 106, data is received from host terminal 102 and written to data buffer 114. ECC encoder/decoder 116 and CRC encoder/decoder 118 generate ECCs and CRC codes for data in data buffer 114. Read/write head 108 then writes the data and the generated ECCs and CRC codes to storage medium 106.

When data is to be read from storage medium 106, read/write head 108 reads data and the ECCs and CRC codes from storage medium 106 to data buffer 114. As will be described in greater detail below, any errors in the data read from storage medium 106 are detected and corrected using the ECCs and CRC codes. The data may then be transferred to host terminal 102.

In one exemplary embodiment, data is transferred between host terminal 102 and storage device 104 in data records, which are stored in a cache. The data records are divided into data blocks of a predetermined length, such as 2 kBytes, 4 kBytes, 6 kBytes, and the like. It should be recognized, however, that data blocks of various lengths may be used.

In the present exemplary embodiment, after data blocks are retrieved from storage medium 106, ECCs are used to correct errors in the retrieved data blocks. More specifically, prior to storing data blocks in storage medium 106, ECCs are generated for data sets having data from multiple data blocks and stored with the data blocks in storage medium 106. As will be described in greater detail below, when the data blocks are later retrieved, a data set having an error can be identified based on the data in the data set and the ECC corresponding to the data set, where an error in a retrieved data set indicates that the data in the retrieved data set is different from the data in the data set when the data was originally stored in storage medium 106. Data in a data set identified as having an error is then corrected using the ECC corresponding to the data set.

Additionally, in the present exemplary embodiment, CRC codes are used to detect errors in the retrieved data blocks, where an error in a retrieved data block indicates that the data in the retrieved data block is different from the data in the data block when the data was originally stored in storage medium 106. More specifically, prior to storing a data block in storage medium 106, a CRC code is generated for the data block and stored with the data block in storage medium 106. When the data block is later retrieved, a new CRC code is generated for the retrieved data block. The new CRC code is then compared to the CRC code retrieved from storage medium 106, which corresponds to the retrieved data block and was originally generated for the retrieved data block before storing the retrieved data block in storage medium 106. If the new CRC code and the retrieved CRC code differ, then an error is detected for that data block.

Figure 2:
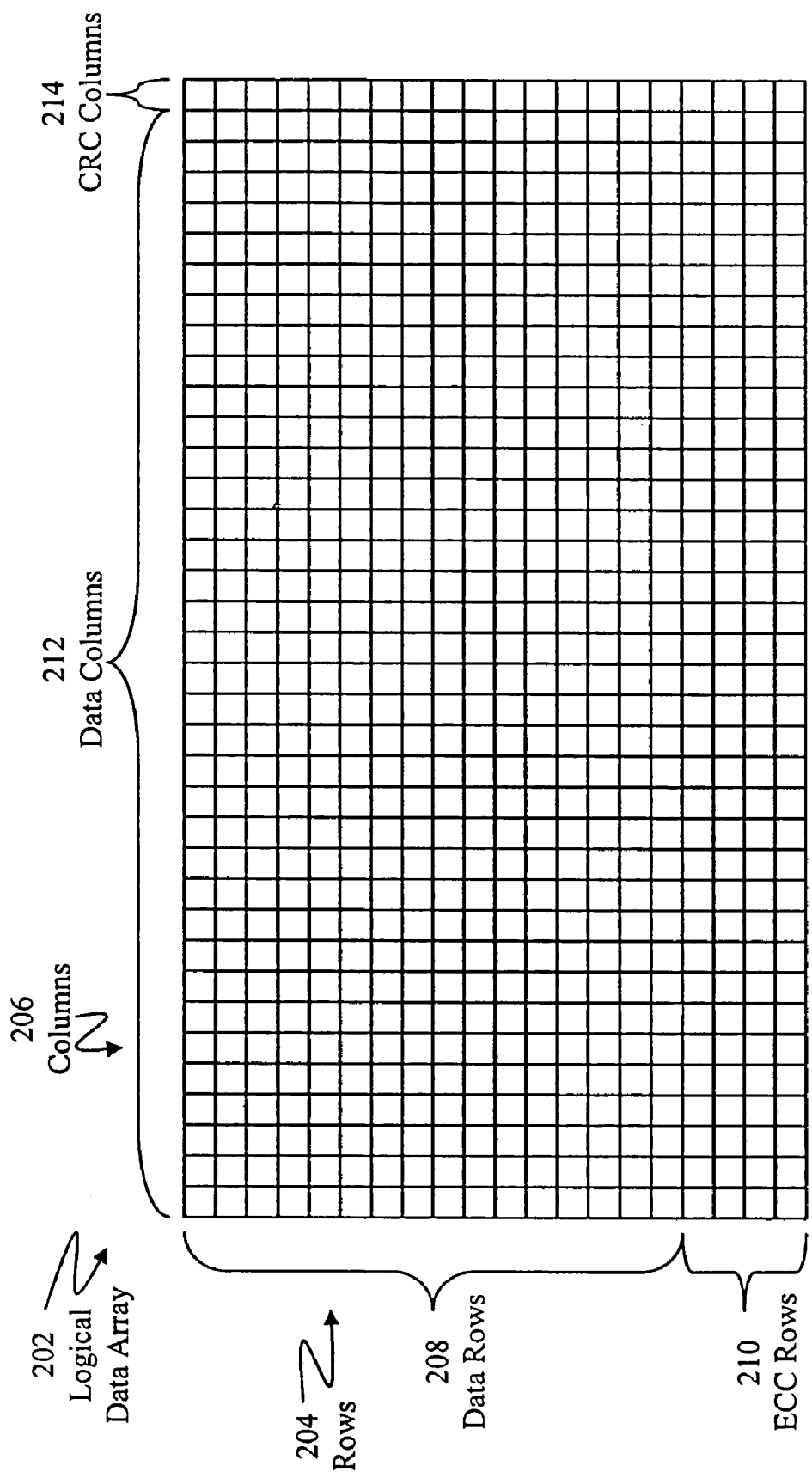
FIG. 2 depicts an exemplary logical data array.

In one exemplary embodiment, a set of data blocks, a set of ECCs, and a set of CRC codes can be read and written together as a group referred to as an "entity." With reference to FIG. 2, a logical data array 202 is depicted of an entity having 16 data blocks, 4 blocks of ECCs, and 20 CRC codes. It should be recognized, however, that an entity can include various numbers of data blocks, ECCs, and CRC codes.

As depicted in FIG. 2, data array 202 includes rows 204 and columns 206. More specifically, data array 202 includes data rows 208, ECC rows 210, data columns 212, and CRC column 214. In the present exemplary embodiment, a data row 208 corresponds to a data block; an ECC row 210 corresponds to a block of ECC; a data column 212 corresponds to a data set having data from multiple data blocks; and a CRC column 214 corresponds to a set of CRC codes for data rows 208 and ECC rows 210.

In one exemplary embodiment, logical data array 202 depicts the form in which an entity is stored in data buffer 114 (FIG. 1). However, it should be recognized that data array 202 need not exist physically in the form depicted in FIGS. 2 and 3. It should also be recognized that data in data array 202, and more particularly the data defined by data rows 208 and data columns 212, need not be contiguous. Instead, in one exemplary embodiment, data received from host terminal 102 (FIG. 1) is interleaved. As such, data defined by data rows 208 and data columns 212 can correspond to portions of separate files received from host terminal 102 (FIG. 1).

Figure 3:
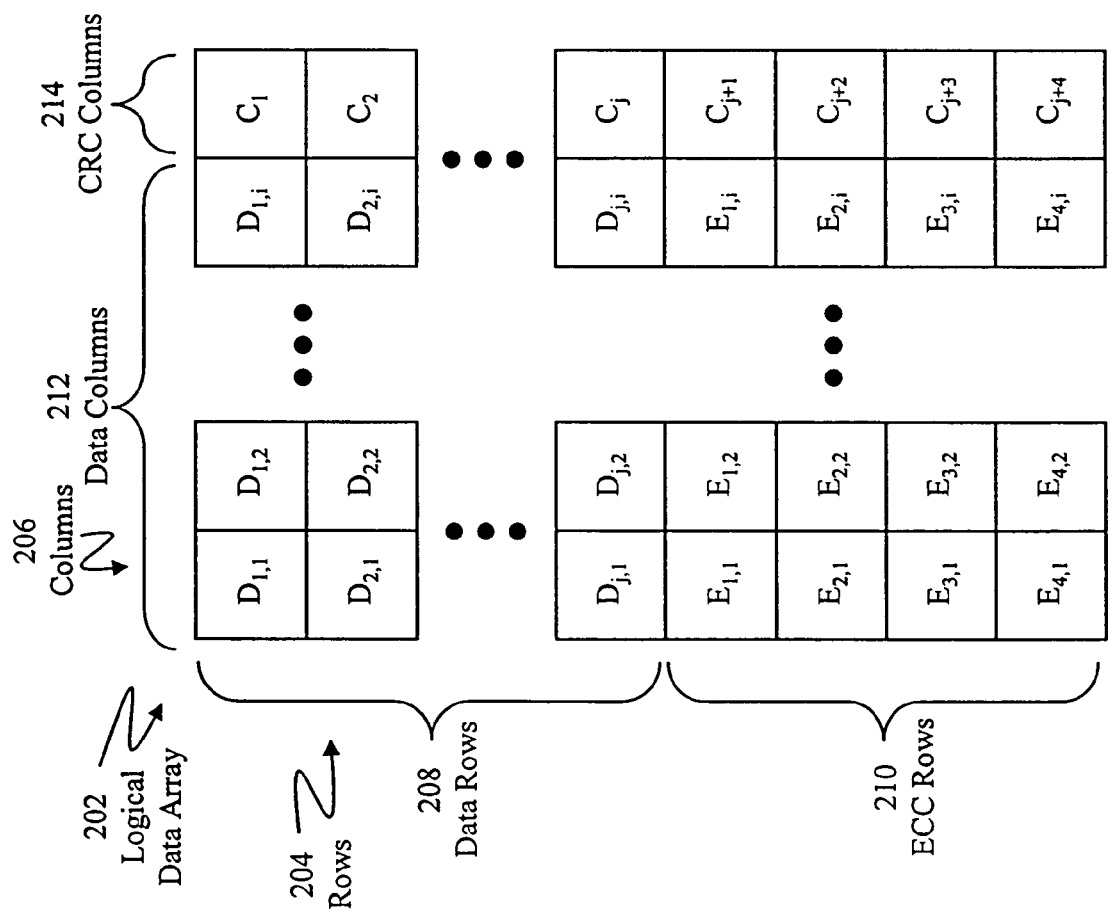
FIG. 3 depicts portions of the exemplary logical data array of FIG. 2.

FIG. 2 depicts logical relationships between data rows 208, ECC rows 210, data columns 212, and CRC column 214 of data array 202. With reference to FIG. 3, portions of data array 202 are shown in greater detail to more clearly illustrate the logical relationships between data rows 208, ECC rows 210, data columns 212, and CRC column 214.

As depicted in FIG. 3, a CRC code in CRC column 214 corresponds to a row 204 in data array 202 and is used to detect an error in a row 204. For example, CRC code $C_1$ corresponds to the first data row 208 of data array 202, which corresponds to the first data block. Thus, to detect an error in the first data row 208, after retrieving the first data row 208 from storage medium 106 (FIG. 1), a new CRC code $C_1'$ is generated for the retrieved first data row 208. The new CRC code $C_1'$ is then compared to the CRC code retrieved from storage medium 106 (FIG. 1) corresponding to the retrieved first data row 208 (i.e., CRC code $C_1$). If the new CRC code $C_1'$ and the retrieved CRC code $C_1$ differ, then an error is detected for the first data row 208.

As also depicted in FIG. 3, ECCs in ECC rows 210 correspond to data columns 212, which correspond to data sets having data from multiple data blocks, and may be used to correct errors in data columns 212. For example, ECCs $E_{1,1}$, $E_{2,1}$, $E_{3,1}$, and $E_{4,1}$ correspond to the first data column 212 and may be used to correct any errors in the first data column 212 (i.e., data $D_{1,1}, D_{2,1}, \ldots, D_{j,1}$). ECCs $E_{1,i}$, $E_{2,i}$, $E_{3,i}$, and $E_{4,i}$ correspond to the last data column 212 and may be used to correct any errors in the last data column 212 (i.e., data $D_{1,i}, D_{2,i}, \ldots, D_{j,i}$).

In the present exemplary embodiment, a cell in a data column 212 (i.e., a data cell) represents a byte of a data block. Thus, a data column 212 of data array 202 and a cell in ECC row 210 (i.e., an ECC cell) correspond to a byte of the data blocks of data rows 208.

For example, the first data column 212 and ECC $E_{1,1}$ correspond to the first bytes of the data blocks in data rows 208 (i.e., data $D_{1,1}, D_{2,1}, \ldots, D_{j,1}$). Thus, ECC $E_{1,1}$ may be used to correct a data cell in the first data column 212 (i.e., data $D_{1,1}, D_{2,1}, \ldots, D_{j,1}$). The second data column 212 and ECC $E_{1,2}$ correspond to the second byte of data blocks in data rows 208 (i.e., data $D_{1,2}, D_{2,2}, \ldots, D_{j,2}$). Thus, ECC $E_{1,2}$ may be used to correct a data cell in the second data column 212 (i.e., data $D_{1,2}, D_{2,2}, \ldots, D_{j,2}$).

Additionally, in the present exemplary embodiment, an ECC may be used to correct a single data cell in a data column 212. Thus, for a data column 212, a total of 4 data cells can be corrected using the 4 ECC cells in the data column 212. For example, ECC $E_{1,1}$ may be used to correct a data cell in the first data column 212 (i.e., data $D_{1,1}$, $D_{2,1}, \ldots, D_{j,1}$). ECC $E_{2,1}$ may be used to correct a second data cell in the first data column 212. ECC $E_{3,1}$ may be used to correct a third data cell in the first data column 212. ECC $E_{4,1}$ may be used to correct a fourth data cell in the first data column 212.

In the present exemplary embodiment, an ECC for a data column 212 is generated based on the data in that data column 212. For example, ECCs $E_{1,1}$, $E_{2,1}$, $E_{3,1}$, and $E_{4,1}$ are generated based on the first data column 212 (i.e., data $D_{1,1}$, $D_{2,1}$, ..., $D_{j,1}$,). As described above, with reference to FIG. 1, ECCs are generated by ECC encoder 116. As also described above, ECCs are initially generated for data received from host terminal 102. The generated ECCs and the received data are then stored in storage medium 106.

With reference again to FIG. 3, in one exemplary embodiment, the ECCs in ECC rows 210 are Reed-Soloman codes generated based on data columns 212. For example, ECC $E_{1,1}$, is a Reed-Solomon code generated based on the first data column 212 (i.e., data $D_{1,1}$, $D_{2,1}$, ..., $D_{j,1}$). For a more detailed description of Reed-Solomon codes, see Peterson & Weldon, Error Correcting Codes, 2d Edition, MIT Press, 1972, which is incorporated in its entirety herein by reference. It should be recognized, however, that various types of error correction codes may be used.

In the present exemplary embodiment, ECCs $E_{2,1}$, $E_{3,1}$, and $E_{4,1}$ are also Reed-Solomon codes generated based on the first data column 212 (i.e., data $D_{1,1}$, $D_{2,1}$, ..., $D_{j,1}$). Although ECCs $E_{1,1}$, $E_{2,1}$, $E_{3,1}$, and $E_{4,1}$ are generated based on the same set of data (i.e., first data column 212), each ECC is unique as to each other. More specifically, in generating a Reed-Solomon code based on a set of data, a matrix is used to perform an exclusive-OR (XOR) operation of the elements of the set of data in various combinations. Thus, in the present exemplary embodiment, ECCs $E_{1,1}$, $E_{2,1}$, $E_{3,1}$, and $E_{4,1}$ are generated using different matrices. For example, $E_{1,1}$, $E_{2,1}$, $E_{3,1}$, and $E_{4,1}$ are generated using a first, second, third, and fourth matrix, respectively.

As described above, data array 202 includes a CRC column 214, which can be used to detect errors in rows 204. However, CRC column 214 does not indicate the column 206 in which an error exists. For example, CRC $C_2$ can be used to detect an error somewhere in the second data row 212, but the error can exist in any one or more of the data cells in the second data row 208 (i.e., data $D_{2,1}$, $D_{2,2}$, ..., $D_{2,i}$).

Thus, in one exemplary embodiment, the ECCs in ECC rows 210 are used to determine whether a data column 212, which corresponds to a data set having data from multiple data blocks, has errors. More specifically, when Reed-Solomon codes are used, mathematical calculations that includes an exclusive-OR (XOR) operation is performed on an ECC and data in a data column to determine a defective column. In accordance with one characteristic of the Reed-Solomon code, if the data in the data column is the same as when the ECC was calculated, the result of the XOR operation should be 0 (zero). Thus, the result of the XOR operation can be used to determine whether the data column has errors.

For example, assume that data array 202 depicts data, ECCs, and CRC codes that have been retrieved from storage medium 106 (FIG. 1). Thus, the ECCs in ECC rows 210 and the CRC codes in CRC column 214 were previously generated based on data that was originally received from host terminal 102 (FIG. 1). As described above, to determine if there is an error in the first data column 212, an XOR operation is performed on ECC $E_{1,1}$ and data $D_{1,1}$, $D_{2,1}$, ..., or $D_{j,1}$. Thus, if data $D_{1,1}$, $D_{2,1}$, ..., or $D_{j,1}$ have not changed from when ECC $E_{1,1}$ was originally generated, then the XOR operation should produce a zero result. Thus, in one exemplary embodiment, if the XOR operation of an ECC of a data column 212 and the data column 212 produces a zero result, the data column 212 is determined not to have an error. If the XOR operation produces a non-zero result, the data column 212 is determined to have an error.

In another exemplary embodiment, a new ECC is generated based on a data column 212. The newly generated ECC is then compared to the retrieved ECC (i.e., the ECC retrieved from storage medium 106 (FIG. 1), which was originally generated from data received from host terminal 102 (FIG. 1)). The result of the comparison can be used to determine whether the data column 212 has errors.

For example, assume that ECC $E_{1,1}$ is generated from the first data column 212 (i.e., $D_{1,1}$, $D_{2,1}$, ..., or $D_{j,1}$) and that ECC $E_{1,1}$ and the first data column 212 are stored in storage medium 106 (FIG. 1). Now assume that ECC $E_{1,1}$ and the first data column 212 are retrieved from storage medium 106 (FIG. 1). To determine whether the retrieved first data column 212 has any errors, a new ECC (i.e., ECC $E_{1,1}{'}$) is generated based on the retrieved first data column 212. $E_{1,1}{'}$ and $E_{1,1}$ are then compared. If $E_{1,1}{'}$ and $E_{1,1}$ are the same, then there is no error in the retrieved first data column 212. If $E_{1,1}{'}$ and $E_{1,1}$ differ, then there is an error in the retrieved first data column 212.

As noted above, in one exemplary embodiment, ECCs $E_{2,1}$, $E_{3,1}$, and $E_{4,1}$ are also generated from first data column 212. Thus, in order to increase the accuracy of determining whether an error exists in a data column 212, two or more new ECCs corresponding to a data column 212 can be generated based on the retrieved data column 212.

For example, a new ECC $E_{2,1}$ (i.e., E2,1') can be generated from the first data column 212 and compared to retrieved ECC $E_{2,1}$. Additionally or alternatively, a new ECC $E_{3,1}$ (i.e., $E_{3,1}{'}$) can be generated from the first data column 212 and compared to retrieved ECC $E_{3,1}$. Additionally or alternatively, a new ECC $E_{4,1}$ (i.e., $E_{4,1}{'}$) can be generated from the first data column 212 and compared to retrieved ECC $E_{4,1}$.

As also noted above, ECCs $E_{1,1}$, $E_{2,1}$, $E_{3,1}$, and $E_{4,1}$ are generated from different matrices. For example, assume that $E_{1,1}$, $E_{2,1}$, $E_{3,1}$, and $E_{4,1}$ are generated from a first, second, third, and fourth matrix, respectively. Thus, in the above example, $E_{1,1}{'}$, $E_{2,1}{'}$, $E_{3,1}{'}$, and $E_{4,1}{'}$ are also generated from the first, second, third, and fourth matrix, respectively.

Figure 4:
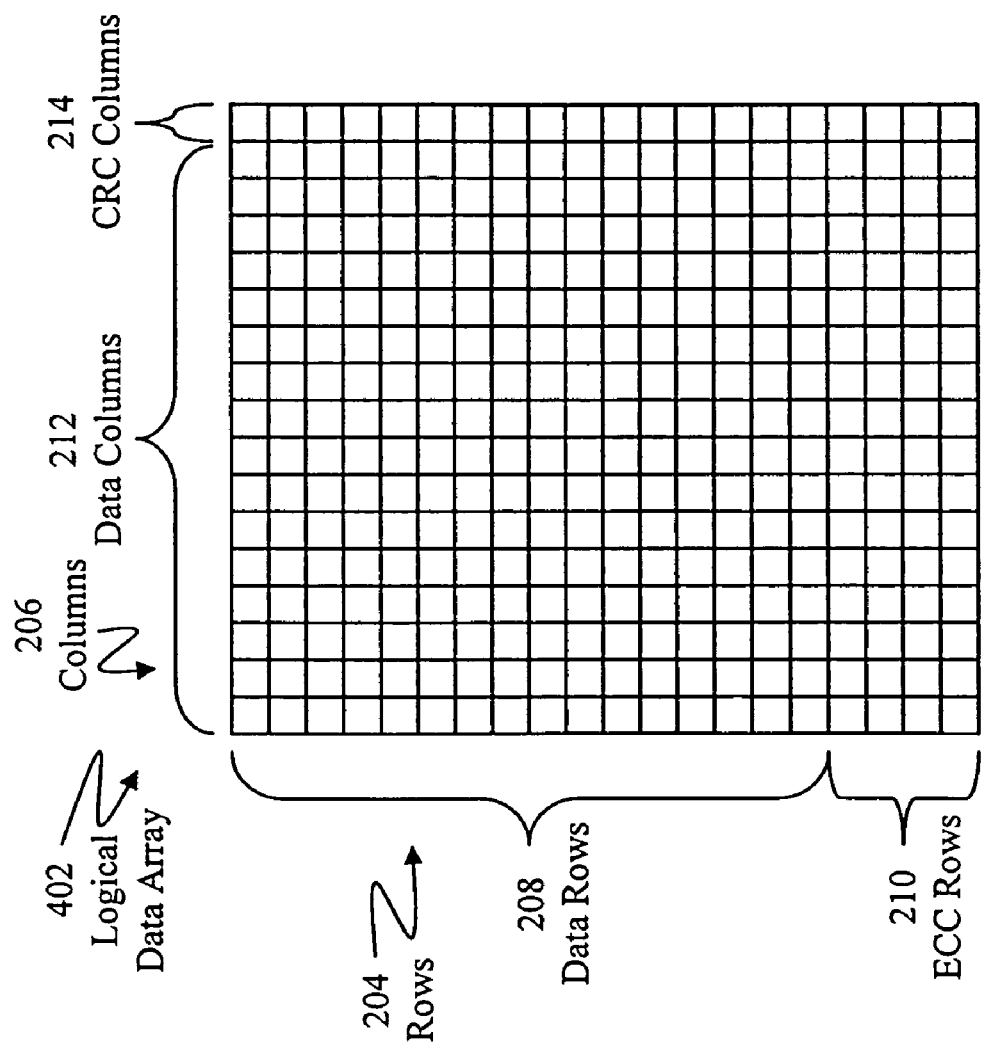
FIG. 4 depicts a reduced logical data array derived from the exemplary logical data array of FIG. 2.

With reference to FIG. 4, in one exemplary embodiment, a reduced logical data array 402 is formed from logical data array 202 (FIG. 2). In the present exemplary embodiment, reduced logical data array 402 only includes data columns 212 in data array 202 (FIG. 2) identified as having errors. ECC rows 210 are then used to correct data rows 208 identified by CRC column 214 as having errors. Because reduced data array 402 is smaller than data array 202 (FIG. 2), reduced data array 402 can be corrected in less time and with fewer numerical computations than data array 202 (FIG. 2).

Alternatively, in one exemplary embodiment, data columns 212 in data array 202 (FIG. 2) identified as having errors are corrected without forming logical data array 402. Thus, a data column 212 in data array 202 (FIG. 2) is examined to determine if it has an error. If the data column 212 is identified as having an error, then data column 212 is corrected before examining another data column 212.

Figure 5:
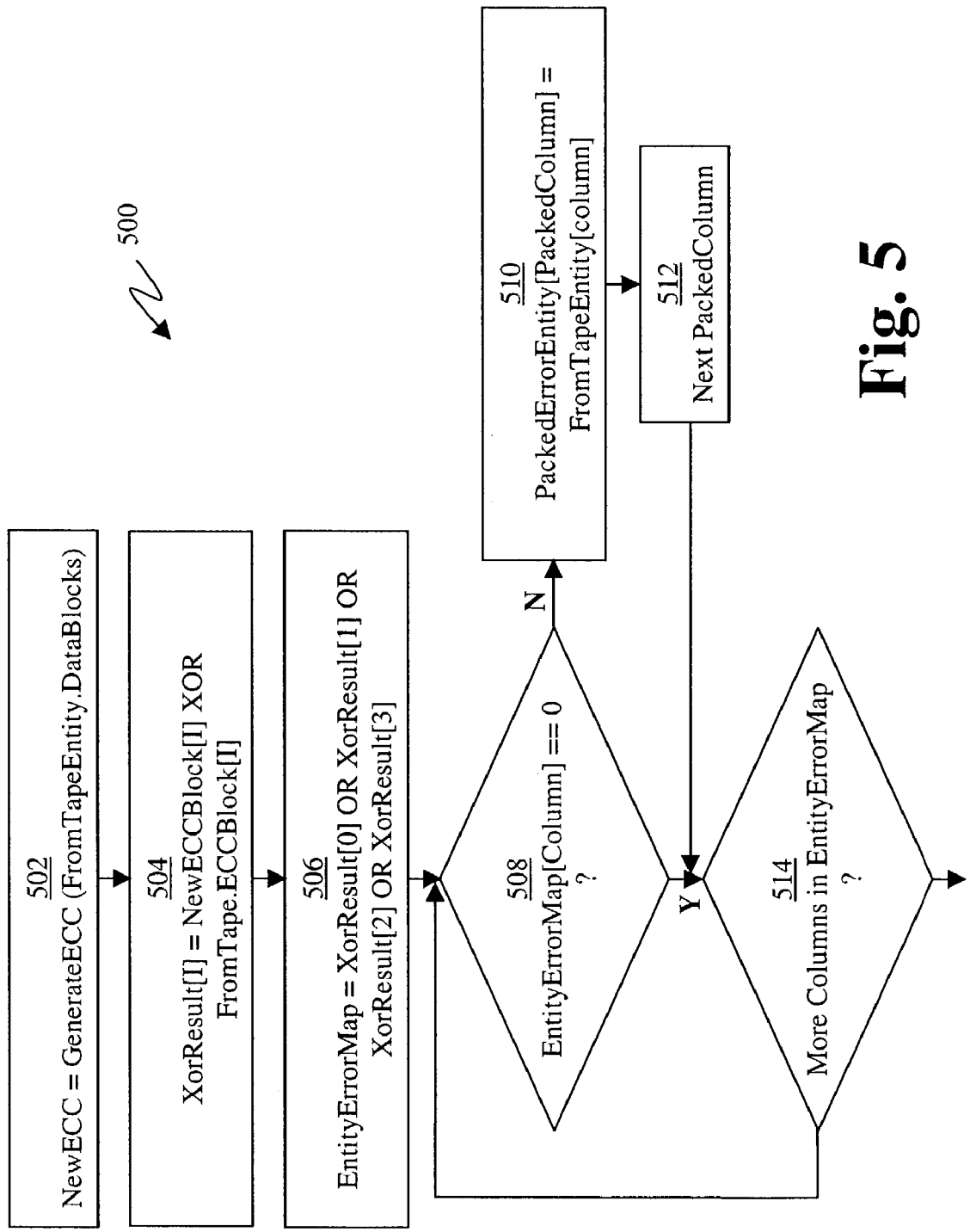
FIG. 5 depicts an exemplary process to correct data retrieved from a storage medium.
Figure 5:
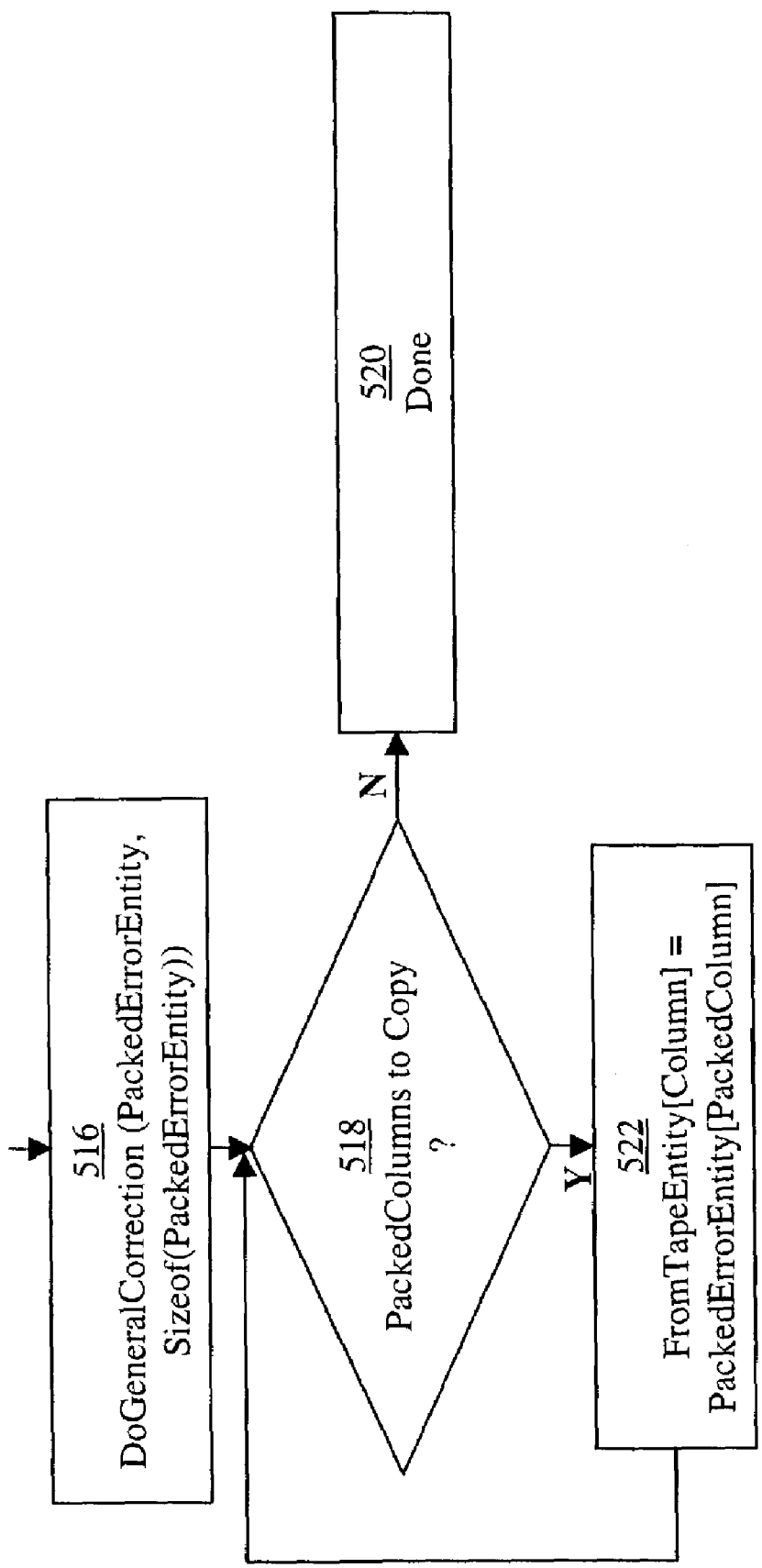

With reference now to FIG. 5, an exemplary process 500 is depicted to correct data stored on a storage medium. More specifically, FIG. 5 depicts exemplary process 500 implemented as a computer program, which includes computer executable instructions to direct the operation of a storage device. For example, with reference to FIG. 1, the process depicted in FIG. 5 can direct the operation of processor 110 of storage device 104. It should be recognized, however, that exemplary process 500 can be implemented in hardware, such as in an Application-Specific Integrated Circuit (ASIC).

With reference again to FIG. 5, in the present exemplary process, the storage device is a tape drive and the storage medium is a magnetic tape. For the sake of example, assume that prior to step 502, data and ECCs for the data have been stored on the tape in the tape drive. Thus, FIG. 5 illustrates an exemplary process to retrieve data stored on the tape and to correct any errors in the retrieved data.

More specifically, in step 502, new ECCs are generated for data blocks retrieved from the tape. More specifically, in the present exemplary embodiment, the data blocks retrieved from the tape (i.e., "FromTapeEntity.DataBlocks") are passed to a routine to generate ECCs (i.e., "GenerateECC"). The result is stored as "NewECC."

As described above and as depicted in FIG. 2, in one exemplary embodiment, an ECC row 210 corresponds to data in data rows 208 of logical data array 202. Each ECC in an ECC row 210 corresponds to a data set having data from multiple data rows 208, which corresponds to a data column 212. Additionally, in one exemplary embodiment, logical data array 202 includes 4 blocks of ECCs, which correspond to ECC rows 210, for 16 data blocks, which correspond to the 16 data rows 208. Thus, assuming that logical data array 202 is used with exemplary process 500 (FIG. 5), step 502 (FIG. 5) corresponds to generating 4 new blocks of ECCs based on data rows 208 retrieved from the tape. It should be recognized, however, that a new ECC can be generated for one data column 212 at a time rather than all at once.

With reference again to FIG. 5, in step 504, a logical XOR operation is performed on the newly generated ECC blocks and the ECC blocks retrieved from the tape. More specifically, in the present exemplary embodiment, an XOR is performed on the newly generated ECC blocks (i.e., "NewECCBlock[I]") and the ECC retrieved from the Tape (i.e., "FromTape.ECCBlock[I]"). The result is stored as "XorResult[I]."

As described above, in one exemplary embodiment, 4 ECC blocks are used for 16 data blocks. Thus, for added reliability, 4 new ECC blocks are generated and 4 XOR operations are performed on the 4 newly generated ECC blocks and the 4 retrieved ECC blocks. The results of the 4 XOR operations are stored as 4 XorResult variables (i.e., XorResult[0], XorResult[1], XorResult[2], and XorResult[3]).

Thus, with reference again to FIG. 5, in step 506, a logical OR operation is performed on the results of the 4 XOR operations in step 504. The result is stored as "EntityErrorMap." In the present exemplary process, each bit of the "EntityErrorMap" variable corresponds to a data column 212 (FIG. 2) with a zero bit indicating that a data column 212 (FIG. 2) does not have an error and a one bit indicating that a data column 212 (FIG. 2) does have an error. It should be recognized that a single XOR operation can be performed using one newly generated ECC block and one retrieved ECC block, in which case step 506 can be omitted.

In step 508, a bit of the "EntityErrorMap" variable is examined to determine if the bit is a zero bit. As described above, if the bit is a one bit, then the data column 212 (FIG. 2) corresponding to the bit has an error. Thus, in step 510, the data column 212 (FIG. 2) identified as having an error (i.e., "FromTapeEntity[column]") is copied to a column in another array (i.e., "PackedErrorEntity[PackedColumn]"). Thus, the "PackedErrorEntity" array includes only the columns identified as having errors. In step 512, the variable "PackedColumn" is incremented.

In step 514, the "EntityErrorMap" variable is examined to determine if there are more bits and thus data columns that need to be examined. If there are additional bits and data columns to be examined, step 508 is repeated.

In step 516, the data columns identified as having errors are corrected. More specifically, in the present exemplary embodiment, the "PackedErrorEntity" array with the size of the "PackedErrorEntity" array is passed to a routine to correct the array (i.e., "DoGeneralCorrection").

In steps 518, 520, and 522, the corrected columns in the corrected array (i.e., "PackedErrorEntity[PackedColumn]") are copied back to the original array (i.e., "FromTapeEntity[Column]").

With reference again to FIGS. 2 and 4, as described above, data array 202 (FIG. 2) and reduced data array 402 (FIG. 4) include columns of check sums used to detect errors in rows 204. More particularly data array 202 (FIG. 2) and 402 (FIG. 4) include CRC columns 214.

As also described above, data array 202 (FIG. 2) and reduced data array 402 (FIG. 4) include a number of ECC rows 210, where each ECC row 210 can be used to correct a single cell in a data column 212. Thus, if the number of rows 204 in data array 202 (FIG. 2) or 402 (FIG. 4) that are indicated as having errors by CRC columns 214 is greater than the number of ECC rows 210, then data array 202 (FIG. 2) or 402 (FIG. 4) typically cannot be corrected using ECC rows 210 with conventional techniques.

For example, in the exemplary embodiment depicted in FIG. 2, data array 202 includes 4 ECC rows 210. Thus, if more than 4 rows 204 in data array 202 are indicated as having errors by CRC column 214, then data array 202 typically cannot be corrected using ECC rows 210 with conventional techniques.

However, because a CRC does not indicate that all of the cells in row 204 have errors, no single column 206 may have as many errors as indicated by CRC column 214. For example, if CRC column 214 indicates that there are 5 rows 204 in data array 202 with errors, the errors may be dispersed throughout data array 202 such that no single column 206 has 5 cells (i.e., rows) with errors. Instead, the errors may exist in completely separate columns 206.

Thus, in one exemplary embodiment, when the number of rows 204 in data array 202 (FIG. 2) or 402 (FIG. 4) indicated as having errors by CRC column 214 is greater than the number of ECC rows 210, columns 206 are individually processed to correct data array 202 (FIG. 2) or 402 (FIG. 4). More particularly, columns 206 are individually processed to verify that the rows in a column 206 have errors as indicated by CRC column 214.

Figure 6:
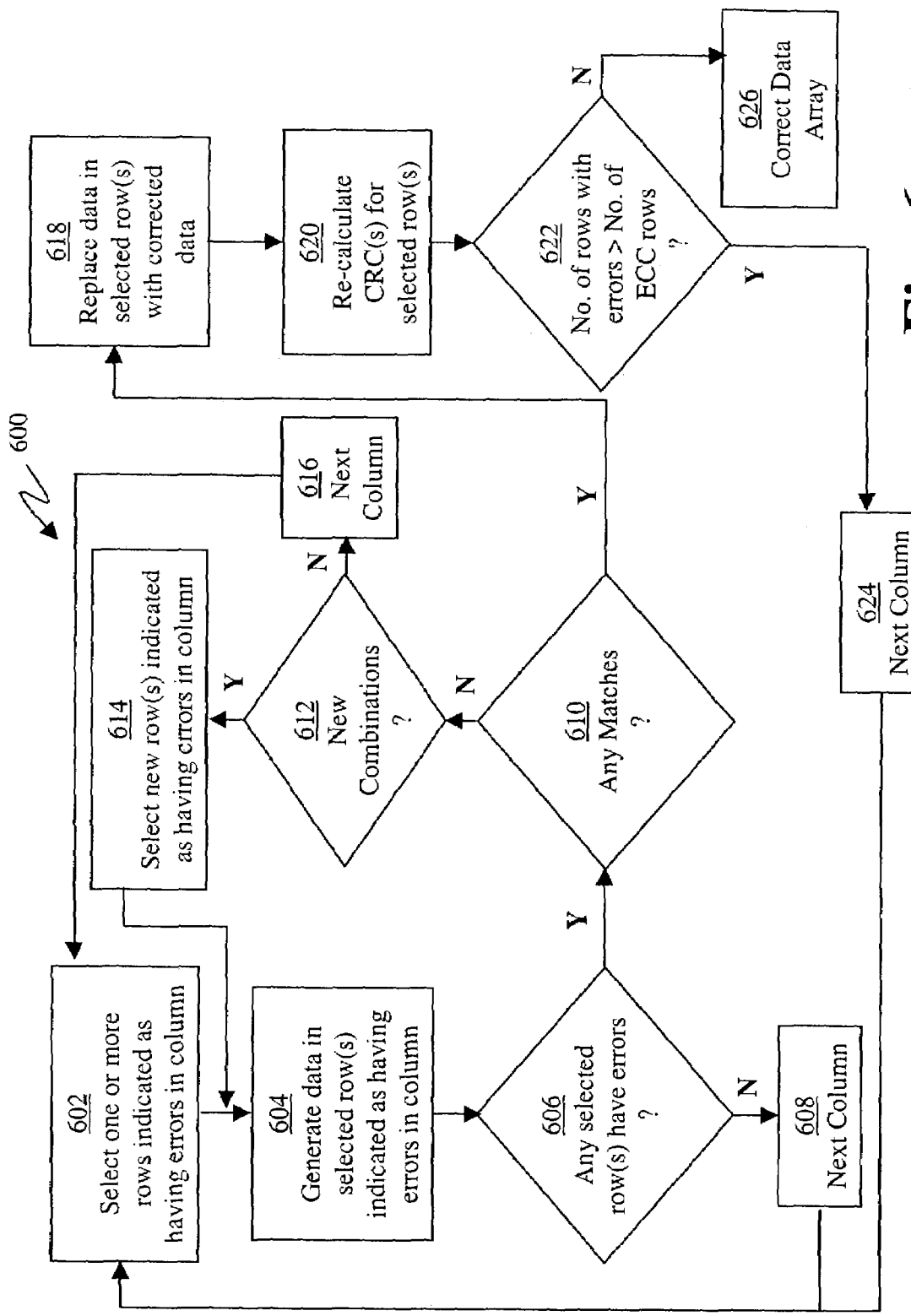
FIG. 6 depicts an exemplary process to verify errors in data retrieved from a storage medium.

With reference to FIG. 6, an exemplary process 600 is depicted for correcting a data array having more rows indicated as having errors than ECC rows. More particularly, if the CRC column of the data array indicates that k rows have errors and the data array has n ECC rows, then k is greater than n. Thus, the data array cannot be corrected using the ECC rows with conventional techniques.

In step 602, for a column in the data array, one or more rows indicated as having errors by the CRC column are selected. The number of rows selected is equal to the number of ECC rows.

In step 604, data for the selected rows are generated using the ECC rows. The data in the non-selected rows (i.e., the rows identified as having errors that were not selected in step 602) are assumed to be correct.

In step 606, the generated data for the selected rows are used to verify the rows indicated as having errors. More particularly, the generated data for the selected rows are compared to the data originally in the selected rows. If the generated and original data for all of these rows are the same, then there are no errors in any of the selected and the non-selected rows of this column (i.e., the data in the selected and the non-selected rows for this column are correct).

In step 608, if in step 606 none of the rows indicated as having errors actually had an error, then another column is processed if there is another column to be processed. For example, with reference to FIG. 2, after processing the first column 206, the second column 206 can be processed. In this manner, each column 206 of data array 202 can be processed. It should be recognized, however, that columns 206 can be processed in any order.

With reference to FIG. 4, if process 600 (FIG. 6) is applied to reduced data array 400, then the determination in step 606 (FIG. 6) would never be negative because each column 206 of data array 400 (FIG. 4) should include at least one row with an error. Thus, when process 600 (FIG. 6) is applied to data array 400, steps 606 and 608 (FIG. 6) can be omitted.

With reference again to FIG. 6, in step 610, a determination is made as to whether any of the generated data for the selected rows match the data originally in the selected rows. If in step 610 none of the generated and original data for the selected rows match, then the data for the selected and the non-selected rows are probably incorrect.

Thus, in step 612, a determination is made as to whether all of the possible combinations of selected rows have been attempted. In step 614, another combination of rows is selected and the process is repeated. In step 616, another column is processed if there is another column to be processed.

If in step 610 the generated and original data for any of the selected rows are the same, then the generated data for the remaining rows (i.e., the selected rows in which the generated and the original data did not match) are the correct data for these rows, and the data for the non-selected rows are also correct. Thus, in step 618, the data in the selected rows in which the generated and the original data did not match are replaced with the generated data for these rows. In step 620, the CRCs for these rows (i.e., the selected rows in which the corrected and the original data did not match) are recalculated.

In step 622, a determination is made as to whether the number of rows indicated as having errors by the CRCs, including the recalculated CRCs, is greater than the number of ECC rows. In step 624, if the number of rows indicated as having errors is still greater than the number of ECC rows, another column is processed if there is another column remaining to be processed. In step 626, if the number of rows indicated as having errors by the new CRC is not more than the number of ECC rows, then the data array can now be corrected using the ECC rows.

To more clearly illustrate process 600, with reference to FIG. 2, assume that data array 202 includes 4 ECC rows 210 (i.e., n=4) and that CRC column 214 indicates that 5 rows 204 (e.g., the $1^{st}$, $3^{rd}$, $5^{th}$, $6^{th}$, and $16^{th}$ rows) have errors (i.e., k=5). More particularly, assume that after retrieving the data blocks corresponding to the $1^{st}$, $3^{rd}$, $5^{th}$, $6^{th}$, and $16^{th}$ rows, a new CRC is generated for each of the retrieved data blocks. The new CRCs are compared to the CRCs originally generated for the retrieved data blocks before storing the retrieved data blocks in storage medium 106 (FIG. 1), and the new CRCs and the originally generated CRCs for these rows 204 did not match, which indicates that data in the retrieved data blocks are not the same as data originally stored in the data blocks.

Thus, in this example, in step 602 (FIG. 6), for a column 206 in data array 202, 4 of the rows indicated as having errors is selected because there are 4 ECC rows 210. For the sake of example, assume that the $1^{st}$ column of data array 202 is selected, and the $3^{rd}$, $5^{th}$, $6^{th}$, and $16^{th}$ rows of the $1^{st}$ column are selected.

In step 604 (FIG. 6), new data corresponding to the $3^{rd}$, $5^{th}$, $6^{th}$, and $16^{th}$ rows of the $1^{st}$ column are generated using the 4 ECC rows. For this example, assume that the original data for the $3^{rd}$, $5^{th}$, $6^{th}$, and $16^{th}$ rows of the $1^{st}$ column are A, B, C, and D, respectively, and the new generated data are A', B', C', and D'. The data in the $1^{st}$ column is assumed to contain correct data.

In step 606, the generated data (i.e., A', B', C', and D') and the original data (i.e., A, B, C, and D) are used to determine if the $3^{rd}$, $5^{th}$, $6^{th}$, or $16^{th}$ row actually has an error. More particularly, A', B', C', and D' are compared to A, B, C, and D.

In step 608, if the comparison of A', B', C', and D' to A, B, C, and D results in all of the data matching, then there was no error in the $1^{st}$ column. Thus, another column, such as the $2^{nd}$ column, is processed.

In step 610, a determination is made as to whether any of the compared data matched. If none of the compared data matched, then in step 612, a determination is made as to whether all of the possible combinations of selected and non-selected rows have been made. In this example, because there are 5 rows indicated as having errors and 4 ECC rows, there are a total of 5 possible combinations of selected rows and non-selected rows. More particularly, the following table lists the various combinations of selected and non-selected rows:

TABLE 1

| Combination | Selected | Non-Selected |
|---|---|---|
| 1 | $3^{rd}$, $5^{th}$, $6^{th}$, $16^{th}$ | $1^{st}$ |
| 2 | $1^{st}$, $5^{th}$, $6^{th}$, $16^{th}$ | $3^{rd}$ |
| 3 | $1^{st}$, $3^{rd}$, $6^{th}$, $16^{th}$ | $5^{th}$ |
| 4 | $1^{st}$, $3^{rd}$, $5^{th}$, $16^{th}$ | $6^{th}$ |
| 5 | $1^{st}$, $3^{rd}$, $5^{th}$, $6^{th}$ | $16^{th}$ |

In step 614, another combination of selected row and non-selected rows are used. In this example, after using combination 1 listed in Table 1, combination 2 can be used. Thus, in step 614, the $3^{rd}$ row of the $1^{st}$ column is now assumed to contain correct data. In repeating step 604, data for the $1^{st}$, $5^{th}$, $6^{th}$, and $16^{th}$ rows are generated using the ECC rows.

In step 616, if all the combinations have been attempted, then another column is processed. For example, after processing the $1^{st}$ column, the $2^{nd}$ column can be processed.

Assume that in step 610 the generated and original data for only the $3^{rd}$ column matched (i.e., A'=A). Thus, in step 618, data for the $5^{th}$, $6^{th}$, and $16^{th}$ rows are replaced with B', C', and D', respectively. In step 620, the CRCs for the $5^{th}$, $6^{th}$, and $16^{th}$ rows are recalculated.

In step 622, a determination is made as to whether the number of rows indicated as having errors by the CRCs, including the recalculated CRCs, is still greater than the number of ECC rows. Thus, in this example, if all of the regenerated CRCs for the $5^{th}$, $6^{th}$, and $16^{th}$ rows still indicate that these rows have errors, then in step 624 another column is processed if there is another column to be processed. However, if any one of the regenerated CRCs for the $5^{th}$, $6^{th}$, and $16^{th}$ rows indicate that there is no longer an error in any of these rows, then in step 626 the data array is corrected using the ECC rows.

The above example assumed that a data array included 4 ECC rows and that 5 rows were indicated as having errors. As noted above, the data array can include any number of ECC rows and any number of the rows can be indicated as having errors. For example, if the data array included 4 ECC rows and 6 rows are indicated as having errors, then 4 of the rows indicated as having errors are selected and data for these rows are generated using the 4 ECC rows. The 2 non-selected row are then assumed to contain correct data. As also described above, various combinations of the rows indicated as having errors can be used as selected and non-selected rows in correcting a column.

Although exemplary embodiments have been described, various modifications can be made without departing from the spirit and/or scope of the present invention. Therefore, the present invention should not be construed as being limited to the specific forms shown in the drawings and described above.

I claim:

1. A method of verifying errors in data retrieved from a storage medium, comprising:
    retrieving a plurality of data blocks from the storage medium;
    selecting a data set having data from multiple data blocks,
        wherein the data set includes a plurality of rows corresponding to the data blocks, and
        wherein a row has data from a data block corresponding to the row;
    retrieving one or more error correction codes (ECCs) from the storage medium,
        wherein the one or more ECCs correspond to the data set;
    retrieving a plurality of check sums from the storage medium,
        wherein a check sum corresponds to a data block;
    identifying data blocks retrieved from the storage medium having errors using the check sums corresponding to the data blocks; and
    when the number of data blocks identified as having errors is greater than the number of ECCs for the data set:
        selecting a first set of rows in the data set corresponding to the data blocks identified as having errors,
            wherein the number of rows in the first set of rows is equal to the number of ECCs for the data set and less than the number of data blocks identified as having errors,
        generating data for the first set of rows using the ECCs for the data set, and
        verifying the rows corresponding to the data blocks identified as having errors based on the generated data for the first set of rows.

2. The method of claim 1, wherein verifying comprises:
    comparing the generated data for the first set of rows to the data originally in the first set of rows; and
    when all of the generated data and data originally in the first set of rows match, processing another data set having data from multiple data blocks.

3. The method of claim 1, wherein verifying comprises:
    comparing the generated data for the first set of rows to the data originally in the first set of rows; and
    when none of the generated data and data originally in the first set of rows match:
        selecting a second set of rows in the data set corresponding to the data blocks identified as having errors, wherein at least one row in the second set differs from the rows in the first set,
        generating data for the second set of rows using the ECCs, and
        verifying the rows corresponding to the data blocks identified as having errors based on the generated data for the second set of rows.

4. The method of claim 1, wherein verifying comprises:
    comparing the generated data for the first set of rows to the data originally in the first set of rows; and
    when the generated data and data originally in one or more rows of the first set of rows match (matching rows) and the generated data and data originally in one or more rows of the first set of rows do not match (non-matching rows),
    replacing the data originally in the non-matching rows with the generated data.

5. The method of claim 4, further comprising:
    generating check sums for the data blocks corresponding to the non-matching rows; and
    determining the number of data blocks identified as having errors using the generated check sums.

6. The method of claim 5, further comprising:
    when the determined number of data blocks identified as having errors is greater than the number of ECCs for the data set, processing another data set having data from multiple data blocks.

7. The method of claim 5, further comprising:
    when the determined number of data blocks identified as having errors is not greater than the number of ECCs for the data set, correcting the data blocks using the ECCs.

8. The method of claim 1, wherein the plurality of data blocks retrieved from the storage medium form a first logical data array having rows and columns, wherein a data block corresponds to a row in the first logical data array and the selected data set corresponds to a column in the first logical data array.

9. The method of claim 8 further comprising:
    forming a second logical data array from the first logical data array, wherein the second logical data array only includes columns from the first logical data array identified as having errors, and wherein the selected data set corresponds to a column in the second logical data array.

10. The method of claim 1, wherein the check sums are cyclic redundancy codes and the ECCs are Reed-Solomon codes.

11. The method of claim 1, wherein the selected data set corresponds to a byte-sized portion of multiple data blocks.

12. A system of verifying errors in data retrieved from a storage medium, comprising:
    a data buffer including:
        a plurality of data blocks retrieved from the storage medium,
        one or more error correction codes (ECCs) retrieved from the storage medium, and
        a plurality of check sums retrieved from the storage medium, wherein a check sum corresponds to a data block; and
a processor configured to:
select a data set having data from multiple data blocks in the data buffer,
wherein the data set includes a plurality of rows corresponding to the data blocks, and
wherein the one or more ECCs correspond to the data set,
identify data blocks retrieved from the storage medium having errors using the check sums corresponding to the data blocks, and
when the number of data blocks identified as having errors is greater than the number of ECCs for the data set:
select a first set of rows in the data set corresponding to the data blocks identified as having errors,
wherein the number of rows in the first set of rows is equal to the number of ECCs for the data set and less than the number of data blocks identified as having errors,
generate data for the first set of rows using the ECCs for the data set, and
verify the rows corresponding to the data blocks identified as having errors based on the generated data for the first set of rows.

13. The system of claim 12, wherein the rows corresponding to the data blocks identified as having errors are verified by:
comparing the generated data for the first set of rows to the data originally in the first set of rows; and
when all of the generated data and data originally in the first set of rows match, processing another data set having data from multiple data blocks.

14. The system of claim 12, the rows corresponding to the data blocks identified as having errors are verified by:
comparing the generated data for the first set of rows to the data originally in the first set of rows; and
when none of the generated data and data originally in the first set of rows match:
selecting a second set of rows in the data set corresponding to the data blocks identified as having errors, wherein at least one row in the second set differs from the rows in the first set,
generating data for the second set of rows using the ECCs, and
verifying the rows corresponding to the data blocks identified as having errors based on the generated data for the second set of rows.

15. The system of claim 12, the rows corresponding to the data blocks identified as having errors are verified by:
comparing the generated data for the first set of rows to the data originally in the first set of rows; and
when the generated data and data originally in one or more rows of the first set of rows match (matching rows) and the generated data and data originally in one or more rows of the first set of rows do not match (non-matching rows),
replacing the data originally in the non-matching rows with the generated data.

16. The system of claim 15, further comprising:
generating check sums for the data blocks corresponding to the non-matching rows; and
determining the number of data blocks identified as having errors using the generated check sums.

17. The system of claim 16, further comprising:
when the determined number of data blocks identified as having errors is greater than the number of ECCs for the data set, processing another data set having data from multiple data blocks.

18. The system of claim 16, further comprising:
when the determined number of data blocks identified as having errors is not greater than the number of ECCs for the data set, correcting the data blocks using the ECCs.

19. The system of claim 12, wherein the data blocks in the data buffer form a logical data array having rows and columns, wherein a data block corresponds to a row in the logical data array and the selected data set corresponds to a column in the logical data array.

20. The system of claim 19, wherein the selected data set corresponds to a byte-sized portion of multiple data blocks.

21. A computer-readable storage medium containing computer executable instructions for causing a computer to verify errors in data retrieved from a storage medium comprising instructions for:
retrieving a plurality of data blocks from the storage medium;
selecting a data set having data from multiple data blocks,
wherein the data set includes a plurality of rows corresponding to the data blocks, and
wherein a row has data from a data block corresponding to the row;
retrieving one or more error correction codes (ECCs) from the storage medium,
wherein the one or more ECCs correspond to the data set;
retrieving a plurality of check sums from the storage medium,
wherein a check sum corresponds to a data block;
identifying data blocks retrieved from the storage medium having errors using the check sums corresponding to the data blocks; and
when the number of data blocks identified as having errors is greater than the number of ECCs for the data set:
selecting a first set of rows in the data set corresponding to the data blocks identified as having errors,
wherein the number of rows in the first set of rows is equal to the number of ECCs for the data set and less than the number of data blocks identified as having errors,
generating data for the first set of rows using the ECCs for the data set, and
verifying the rows corresponding to the data blocks identified as having errors based on the generated data for the first set of rows.

22. The computer-readable medium of claim 21, wherein verifying comprises:
comparing the generated data for the first set of rows to the data originally in the first set of rows; and
when all of the generated data and data originally in the first set of rows match, processing another data set having data from multiple data blocks.

23. The computer-readable medium of claim 21, wherein verifying comprises:
comparing the generated data for the first set of rows to the data originally in the first set of rows; and
when none of the generated data and data originally in the first set of rows match:
selecting a second set of rows in the data set corresponding to the data blocks identified as having errors, wherein at least one row in the second set differs from the rows in the first set, generating data for the second set of rows using the ECCs, and verifying the rows corresponding to the data blocks identified as having errors based on the generated data for the second set of rows.

24. The computer-readable medium of claim 21, wherein verifying comprises:

comparing the generated data for the first set of rows to the data originally in the first set of rows; and when the generated data and data originally in one or more rows of the first set of rows match (matching rows) and the generated data and data originally in one or more rows of the first set of rows do not match (non-matching rows), replacing the data originally in the non-matching rows with the generated data.

25. The computer-readable medium of claim 24, further comprising:

generating check sums for the data blocks corresponding to the non-matching rows; and determining the number of data blocks identified as having errors using the generated check sums.

26. The computer-readable medium of claim 25, further comprising:

when the determined number of data blocks identified as having errors is greater than the number of ECCs for the data set, processing another data set having data from multiple data blocks.

27. The computer-readable medium of claim 25, further comprising:

when the determined number of data blocks identified as having errors is not greater than the number of ECCs for the data set, correcting the data blocks using the ECCs.

* * * * *